United States Patent [19]

Fujino et al.

[11] Patent Number: 5,091,050
[45] Date of Patent: Feb. 25, 1992

[54] DRY ETCHING METHOD

[76] Inventors: Makoto Fujino, B-420, Toshiba Isogo Dairoku Ryo, 2-8-2, Shiomidai, Isogo-Ku, Yokohama-Shi, Kanagawa-Ken; Isahiro Hasegawa, 201, Saiki Heights, 7-12-16, Tomioka-Nishi, Kanazawa-Ku, Yokohama-Shi, Kanagawa-Ken; Masao Ito, 615, Toshiba Shinkoyasu Ryo, 2-14-10, Shinkoyasu, Kanagawa-Ku, Yokohama-Shi, Kanagawa-Ken, all of Japan

[21] Appl. No.: 175,284

[22] Filed: Mar. 30, 1988

[30] Foreign Application Priority Data

Mar. 31, 1987 [JP] Japan ............................. 62-79165

[51] Int. Cl.$^5$ ............................................. C23F 1/00
[52] U.S. Cl. ..................... 156/643; 156/646; 156/656; 156/657; 156/662; 156/664; 156/665; 156/666
[58] Field of Search ............... 156/643, 646, 664, 665, 156/666, 656, 657, 662; 252/79.1

[56] References Cited

U.S. PATENT DOCUMENTS

| | | |
|---|---|---|
| 4,412,885 | 11/1983 | Wang et al. .......................... 156/643 |
| 4,505,782 | 3/1985 | Jacob et al. .......................... 156/643 |
| 4,618,398 | 10/1986 | Nawata et al. ....................... 156/643 |
| 4,659,426 | 4/1987 | Fuller et al. .......................... 156/643 |

FOREIGN PATENT DOCUMENTS

| | | |
|---|---|---|
| 020935 | 1/1981 | European Pat. Off. . |
| 53-20769 | 4/1978 | Japan . |
| 53-146939 | 12/1978 | Japan .................................. 156/643 |
| 58-153334 | 12/1983 | Japan . |
| 60-228687 | 11/1985 | Japan . |
| 62-37382 | 2/1987 | Japan .................................. 156/643 |
| 2081160 | 2/1982 | United Kingdom . |

OTHER PUBLICATIONS

Broydo, "Important Considerations in Selecting Anisotropic Plasma Etching Equipment," Solid State Technology, Apr. 1983, pp. 159-165.

Schaible et al., "Preferential Lateral Chemical Etching in Reactive Ion Etching of Aluminum and Aluminum Alloys," J. Vac. Sci. Technol., 16(2), Mar./Apr. 1979, pp. 377-380.

Downey et al., "Introduction to Reactive Ion Beam Etching," Solid State Technology, Feb. 1981, pp. 121-127.

*Primary Examiner*—David A. Simmons
*Assistant Examiner*—Thi Dang

[57] ABSTRACT

A dry etching method of etching a material to be etched including a transition metal using an etching gas including a carbon oxide gas is provided. The carbon oxide gas may be carbon monoxide gas, carbon dioxide gas, or mixtures of these gases. The carbon oxide gas is preferably in accordance with the relationship "R=X/3 to 200X" where "X" is the ratio of the number of transition metal atoms to the total number of metal atoms and "R" is the ratio of the number of molecules of oxide of carbon to the number of halogen atoms. Such a dry etching is particularly preferably carried out when the material to be etched is aluminum-silicon alloy, the transition metal is copper, the etching gas is mixed gas of chlorine gas, boron trichloride gas and helium gas, and the carbon oxide gas is carbon monoxide.

12 Claims, 3 Drawing Sheets

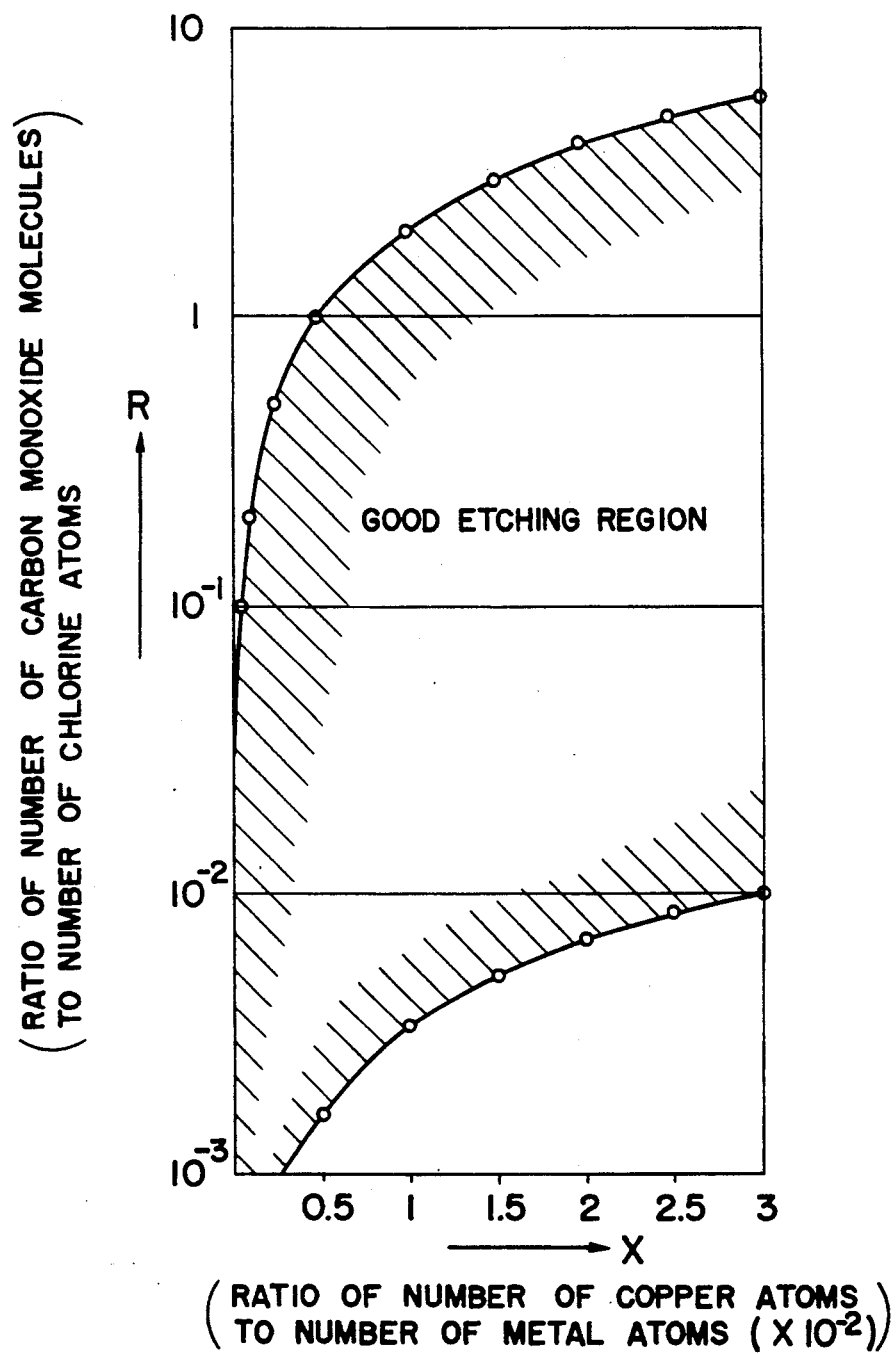
F I G. 3

5,091,050

DRY ETCHING METHOD

BACKGROUND OF THE INVENTION

This invention relates to a dry etching method used for applying etching to a metal film stacked on a semiconductor substrate to form a metal wiring layer, etc.

An arrangement used for a conventional dry etching method is shown in cross section in FIG. 1. A gas inlet 2 is formed in the upper surface of a reaction chamber 1 and an exhaust opening 3 is formed in the side surface of the reaction chamber 1. A metal plate or a semiconductor substrate on which a metal film is formed serving as a material 4 subject to etching is set within the reaction chamber 1. The exhaust opening 3 is connected to a decompressor (not shown) such as a vacuum pump. Thus, the interior of the reaction chamber 1 is in a decompressed condition. For a reactive gas for etching, a gas containing, as the main component, a halogen, e.g., fluorine, chlorine, bromine, or the like is used. Such a gas is introduced from the gas inlet 2 into the reaction chamber 1. Thus, etching is carried out. The reason why halogen is used is that chemical reaction force is large and vapor pressure of reaction product produced by etching is high, thus being easy to remove. This reactive gas is introduced into the reaction chamber 1 with it being raw, or in a plasma state. On the other hand, for the material 4 to be etched, as shown in FIG. 2, a metal layer 6 of, e.g., aluminum is stacked on a foundation 7 such as a base plate or substrate. On the metal layer 6, a resist 5 serving as a masking agent is coated. The reactive gas introduced into the reaction chamber 1 reacts with the metal layer 6 in the form of raw gas 8, ion 9 or radical 10 to form a reaction product 11. The reaction product 11 thus produced is exhausted from the exhaust opening 3.

However, where the vapor pressure of the reaction product 11 is low, such a product is difficult to exhaust, so that it stays within the reaction chamber 1, thus damaging etching. Particularly, where the material 4 to be etched is a metal alloy including a transition metal such as copper, the vapor pressure of the reaction product thereof is low. Thus, not only etching is damaged, but also etching residue is produced, resulting in the problem that the target pattern cannot be formed. For example, when etching is applied to Al-Si alloy using chlorine gas, the etching speed is 6000 Å/min. If copper is included therein, copper remains as a residue with it not being subjected to etching.

As just described above, where the material to be etched is a metal alloy containing transition metal, there is the problem that dry etching is not smoothly carried out.

SUMMARY OF THE INVENTION

This invention has been made in view of the above and its object is to provide a dry etching method capable of performing a good or excellent etching even when transition metal is included.

The above-mentioned object is achieved by a dry etching method in which etching is applied to material to be etched including transition metal using an etching gas containing carbon oxide gas.

In accordance with this invention, since a carbon oxide gas is included into an etching gas to produce a reaction product having high vapor pressure, the reaction product is excellently exhausted, so that etching smoothly proceeds.

BRIEF DESCRIPTION OF THE DRAWINGS

In the accompanying drawings:

FIG. 3 is a graph showing a compounding ratio of carbon oxide gas versus a compounding ratio of transition metal in a good etching region;

DETAILED DESCRIPTION OF THE INVENTION

In the dry etching method according to this invention, metal to be etched is aluminum, aluminum-silicon alloy, and others. For reactive gas for etching, halogen, e.g., chlorine, bromine, fluorine, or the like is suitable. Such a simple substance or a mixture obtained by mixing two kinds of these gases or more is used. In this invention, carbon oxide gas is mixed into reactive gas and is subjected to etching. For the carbon oxide gas, carbon monoxide, carbon dioxide, or a mixture obtained by suitably mixing them is used. The reactive gas reacts with the material to be etched with it being as raw gas or in a plasma state to thereby conduct etching. At this time, the carbon oxide gas reacts at the same time, so that reaction product having high vapor pressure is produced. For example, when carbon monoxide gas is used as the carbon oxide gas and chlorine gas is used as the reactive gas, $M_2Cl_2(CO)$ having high vapor pressure is produced by the reaction with the transition metal M in the metal and is readily exhausted, thus making it possible to smoothly and securely perform etching.

The compounding ratio of the carbon oxide gas is suitably determined depending upon the kind thereof, reactive gas used or property of material to be etched. FIG. 3 shows an example of a graph for determining such a compounding ratio. In the case shown in this FIGURE, mixed gas of chlorine ($Cl_2$), boron trichloride ($BCl_3$) and helium (He) is used for reactive gas, and carbon monoxide (CO) is compounded or mixed thereinto. Moreover, aluminum-silica alloy including copper (Cu) as transition metal is selected as material to be etched. In this case, Al of 98.5%, Si of 1% and Cu of 0.5% are included. On the ordinate of FIG. 3, ratio of the number of CO molecules with respect to the number of Cl atoms, i.e., R = (the number of CO molecules)/(the number of Cl atoms) is plotted in a logarithmic manner. On the abscissa, ratio X of the number of atoms of transition metal Cu included in the metal, i.e., X = the number of Cu atoms/the number of atoms of the entire metals is plotted in unit of $X \times 10^{-2}$.

Since Cu as transition metal is 0.5% in the above-mentioned example, X takes the value of $0.5 \times 10^{-2}$. As is clear from FIG. 3, when $X = 0.5 \times 10^{-2}$, good or excellent etching is carried out in a range of R = 0.0016 to 1.0.

Figure 1:
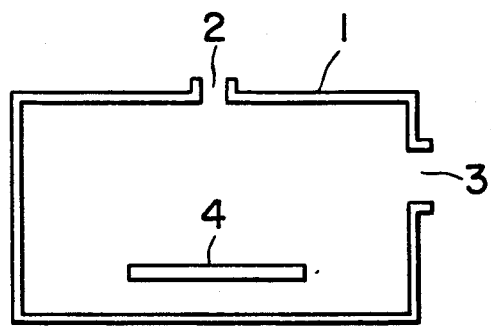
FIG. 1 is a cross sectional view showing a conventional dry etching equipment.
Figure 2:
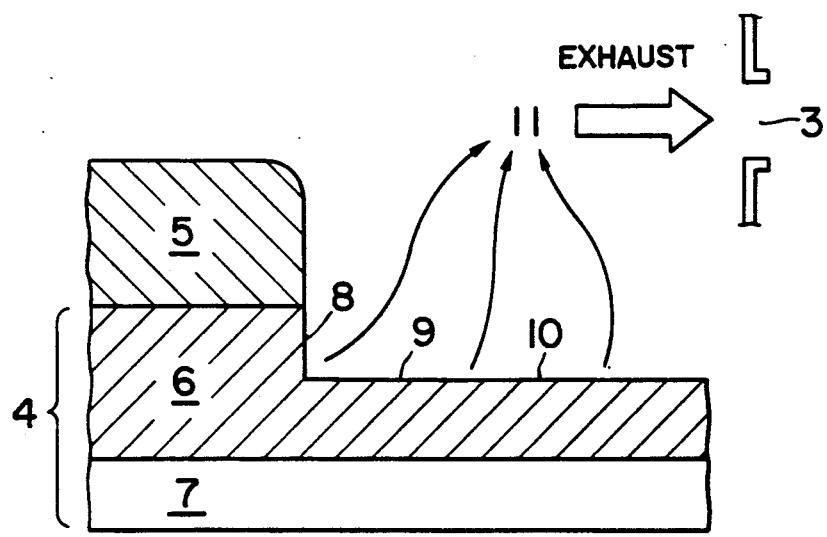
FIG. 2 is a cross sectional view showing the mechanism of etching.
Figure 4:
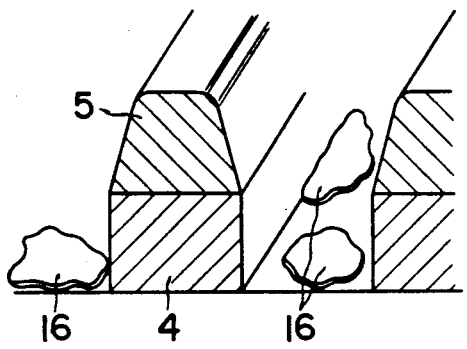
FIGS. 4(a), 4(b) and 4(c) are perspective views of etching states under various conditions.
Figure 4:
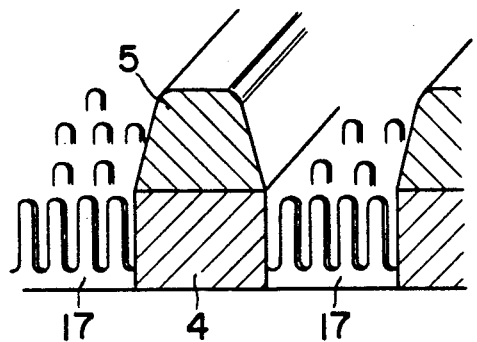
Figure 4:
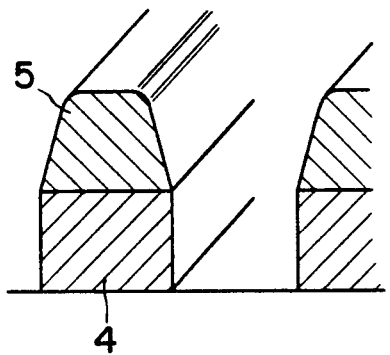

FIG. 4 shows the etching state in this case. On a predetermined portion of the material 4 to be etched consisting of Al-Si-Cu alloy, a resist 5 is coated. When etching is carried out in the range of R = 0, i.e., using as etching gas which does not include any CO, a residue 16 of copper is produced at the etched portion (FIG. 4(a)). On the other hand, when R=2, CO content is excessive. In this case, a residue 17 of carbon is produced at the etched portion. On the contrary, in the case of the above-mentioned range R, e.g., R=0.3, etching is excellently carried out. In this case, the reaction product by etching is smoothly exhausted, resulting in no possibility that residue is produced as shown in FIG. 4(c).

When X takes other values, according to FIG. 3, the range of R where good or excellent etching ia performed with respect to X is as follows:

When $X = 1.0 \times 10^{-2}$, good etching is carried out in the range of $R = 0.0032$ to 2.0.

When $X = 1.5 \times 10^{-2}$, good etching is carried out in the range of $R = 0.0050$ to 3.0.

When $X = 2.0 \times 10^{-2}$, good etching is carried out in the range of $R = 0.0070$ to 4.0.

When $X = 2.5 \times 10^{-2}$, good etching is carried out in the range of $R = 0.0085$ to 5.0.

When $X = 3.0 \times 10^{-2}$, good etching is carried out in the range of $R = 0.0100$ to 6.0.

From these measured data, the following relationship substantially holds in regard to X and R:

$R = X/3$ to $200 X$.

Figure 5:
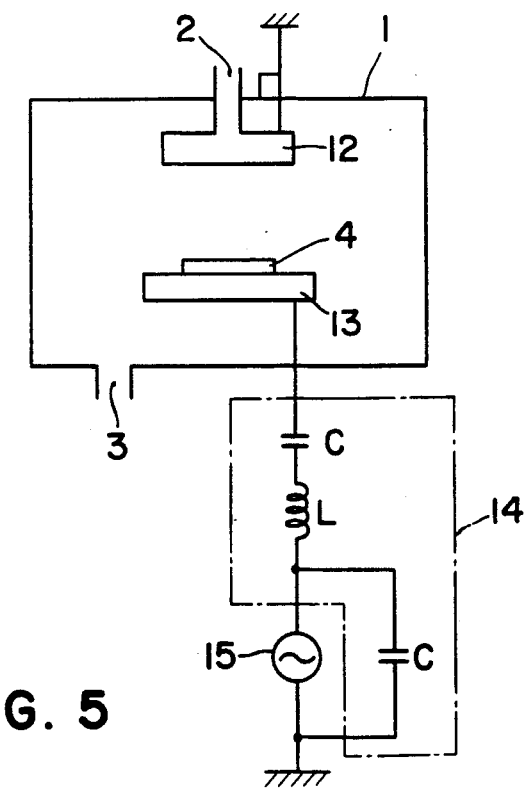
FIG. 5 is a block diagram of a dry etching equipment to which this invention is applied.

FIG. 5 shows an example of a dry etching equipment to which this invention is applied.

Within the reaction chamber 1, parallel flat plate electrodes 12 and 13 are disposed oppositely to each other. The material 4 to be etched is set on the lower electrode 13. The upper electrode 12 is connected to the reaction chamber 1 and is grounded. A nozzle serving as gas inlet 2 is formed in the upper surface of the reaction chamber 1. In addition, a matching circuit 14 composed of a capacitor C, a coil L, etc. is connected to the lower electrode 13, and also connected to a power source 15. Further, the exhaust opening 3 for exhausting reaction product is opened in the lower surface of the reaction chamber 1. With such an equipment, etching gas is introduced from the upper electrode 12 into the reaction chamber 1 via the gas inlet 2 to apply a high voltage to the lower electrode 13 to carry out plasma discharge, thereby carrying out etching.

This invention can be modified in a various manner without being limited to the above-mentioned embodiment. When nickel (Ni), molybdenum (Mo), chromium (Cr), tungsten (W) or iron (Fe) is included as transition metal, excellent etching can be conducted. Further, carbon dioxide ($CO_2$) may be compounded or mixed as carbon oxide gas, or bromine gas may be used as reactive gas. In addition, etching may be carried out without carrying out plasma discharge.

What is claimed is:

1. A method of dry etching a material containing aluminum and a transition metal which comprises etching said material in a reaction chamber with a gaseous etchant containing an oxide of carbon in an amount sufficient to produce a reaction product containing said transition metal and having a vapor pressure such as to enable said reaction product to be readily exhausted from said reaction chamber.

2. A method according to claim 1 wherein said gaseous etchant comprises at least one halogen.

3. A method according to claim 2 wherein said material to be etched comprises an alloy of aluminum and silicon.

4. A method according to claim 3 wherein said transition metal comprises copper.

5. A method according to claim 4 wherein said etchant comprises a mixture of gaseous chlorine, gaseous baron trichloride and helium.

6. A method according to claim 5 wherein said oxide of carbon is monoxide.

7. A method according to claim 5 wherein said oxide of carbon is carbon dioxide.

8. A method according to claim 2 wherein the amount of said oxide of carbon contained in the gaseous etchant is in accordance with the relationship:

$R = X/3$ to $200X$ where "X" is the ratio of the number of transition metal atoms to the total number of metal atoms and "R" is the ratio of the number of molecules of oxide of carbon to the number of halogen atoms.

9. A method according to claim 8, wherein said oxide of carbon is carbon monoxide.

10. A method according to claim 8 wherein said oxide of carbon is carbon dioxide.

11. A method according to claim 1 wherein said material consists essentially of an alloy of aluminum, silicon and a transition metal.

12. A method according to claim 11 wherein said transition metal is copper.

* * * * *